United States Patent [19]
Hamlin

[11] 3,968,563
[45] July 13, 1976

[54] PRECISION REGISTRATION SYSTEM FOR LEADS

[75] Inventor: Arthur Houser Hamlin, Kennett Square, Pa.

[73] Assignee: E. I. Du Pont de Nemours and Company, Wilmington, Del.

[22] Filed: Mar. 27, 1975

[21] Appl. No.: 562,939

[52] U.S. Cl. .............................. 29/591; 29/576 S; 228/180 A; 357/70
[51] Int. Cl.² ........................................ B01J 17/00
[58] Field of Search ............... 29/576 S, 577, 580, 29/591; 228/180

[56] References Cited
UNITED STATES PATENTS 3,440,027   4/1969   Hugle ............................... 29/576 S
3,689,991   9/1972   Aird .................................. 29/577

*Primary Examiner*—W. Tupman

[57] ABSTRACT

Sets of finger-like leads for attachment to semiconductive devices which have a plurality of metallic electrical contacts are etched in a copper foil mounted on a temporary carrier strip simultaneously with indexing holes. The indexing holes are then used to index or register the set of leads when it is bonded to the semiconductive device. If desired, the temporary carrier strip can be removed and the semiconductive device and individual sets of leads are encapsulated in or on permanent carriers.

2 Claims, 8 Drawing Figures

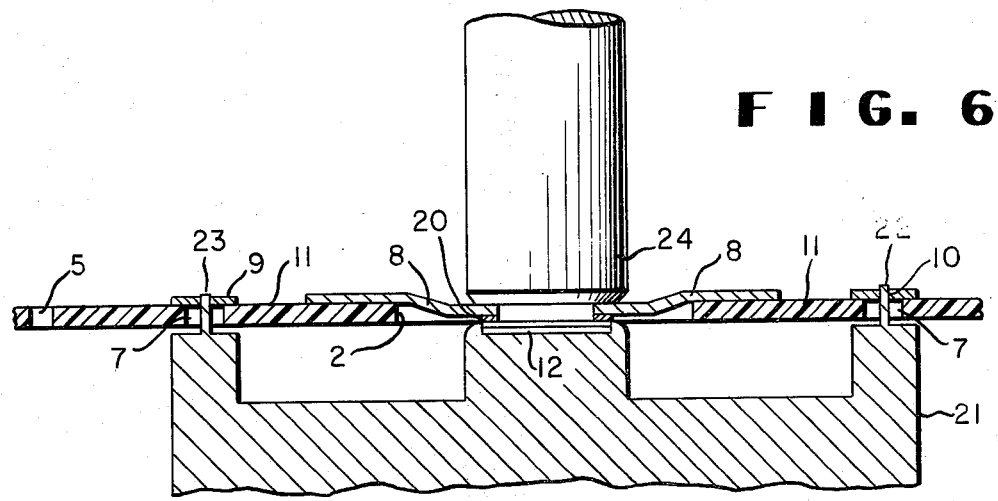
F I G. 6
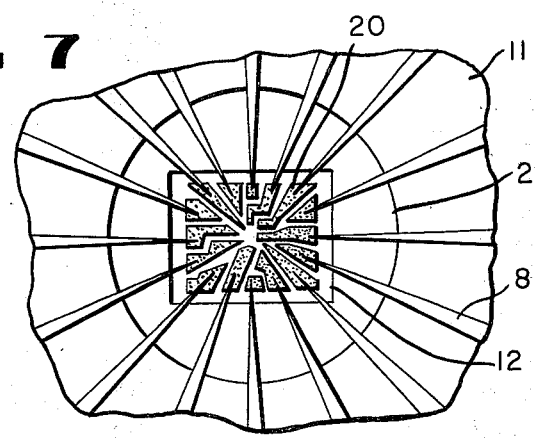
F I G. 7
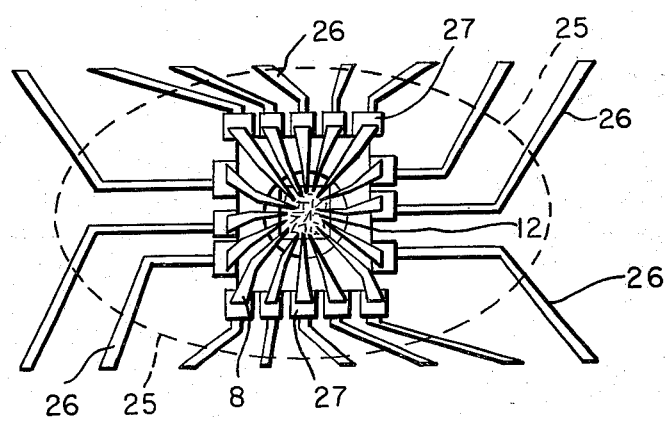
F I G. 8

PRECISION REGISTRATION SYSTEM FOR LEADS

BACKGROUND OF THE INVENTION

The present invention relates to the production of sets of finger-like leads which are affixed to semiconductive devices which devices contain a plurality of electrically active regions. At present, such sets of finger-like leads are made by bonding a strip of conductive material such as copper to a plastic film which film has holes punched therein at regularly spaced intervals. Then a photosensitive resist is applied to the copper and exposed. The exposure imprints the finger patterns of the sets of finger-like leads on the resist, the position of each of which is determined, by registering through one of the holes in the plastic film mentioned above. After development of the resist and etching, and etching away of the copper not protected by the resist, and whatever other processing steps may be required to produce the set of finger-like leads; the holes are again used to determine the position of the set of finger-like leads when it is bonded to the semiconductive device. Because productivity requires the exposure of more than one set of finger-like leads at a time, the same hole used for registering the images on the resist cannot necessarily be used for the bonding step. Furthermore, the use of a full fitting pin (which is used for registering) into a perforated hole can distort the hole and a second pinning may not necessarily give perfect registration. Another problem with the present system is that the registration is through the tortuous route of from perforating machine to the film, from the film to registering pins, from the pins to the imaging master, from the master to the image, etc. These all add to the problem of maintaining accurate tolerances. This above-described system can provide tolerances in the range of ± 2 mils and possibly a little better.

Processes of the type described above are disclosed in U.S. Pat. Nos. 3,689,991; 3,544,857; 3,390,308; and 3,440,027.

SUMMARY OF THE INVENTION

The present invention relates to a process for preparing sets of finger-like leads for attachment to semiconductive devices. In the present invention, registration holes or other registration marks are laid down simultaneously with the finger pattern of the leads. These holes by virtue of being formed simultaneously with the sets of finger-like leads can improve the registration thereof to approximately ± ½ mil which will allow full automatic bonding. This will increase the bonding rate from about 1,000 per hour machine using individual operators on the machines to about 3,000 per hour per machine with one operator handling several machines. This is due to the fact that these semiconductive devices are highly miniaturized and this improvement in accuracy is adequate to eliminate the need to stop and reposition to accommodate variations being experienced in the alignment of the semiconductive devices relative to the fingers.

This in turn will improve the economics of the process to make it much more attractive relative to wire bonding. Basically, the present invention utilizes an etched opening in the copper rather than a punched hole in the plastic film. This can be accomplished by placing additional holes in the base film, and leaving an etched registration system over these holes that is registered relative to the sets of finger-like leads during the exposure step and which is smaller in size than the perforated opening. One example would be round registration hole near the set of finger-like leads in the film with copper over the hole and the copper having a round hole etched therein which hole is smaller than the hole in the film. The smaller etched hole is used for registration at bonding by inserting a full fitting pin (or using optical techniques, etc.) to register the semiconductive device. This small hole is made from the same photoexposure and etching system as the fingers and therefore its registration tolerance is as good as can be laid down. Any error from film dimensional changes will be small because of the short distances involved. Only gross registration then is required of the holes in the film (± 2 mils is satisfactory) and the opening under the copper registration hole to be large enough not to contact the registration pin or light beam. An alternative is to use the corners of an already present hole in the film that is provided with a copper overhang for this purpose. This provides two copper corners to register against.

DESCRIPTION OF THE DRAWINGS

In the drawings:

FIG. 6 is an enlarged view of the apparatus utilized in a preferred system and method for securing semiconductive devices to the carrier of FIG. 3;

FIG. 7 is an enlarged view of a semiconductive device secured to a set of finger-like leads supported by a carrier;

FIG. 8 shows the semiconductive device secured to a set of finger-like leads which, in turn, are secured to a lead encapsulated in a plastic carrier.

DESCRIPTION OF THE INVENTION

Figure 1:
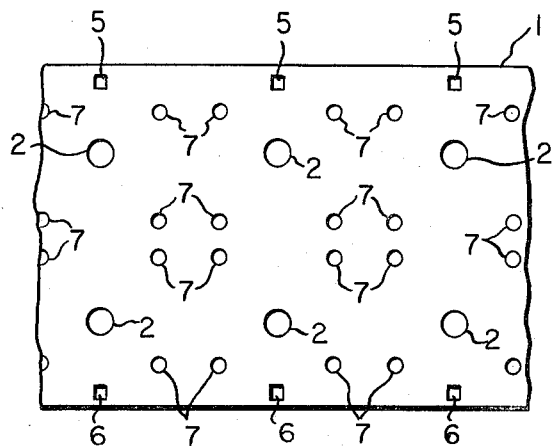
FIG. 1 depicts a segment of a tape of insulating material suitable for use in accordance with the present invention.

FIG. 1 depicts a ribbon or tape 1 of any suitable insulating material; for example, an organic resin such as polyethylene terephthalate or an aromatic polyimide. Generally the tape 1 will be from 0.5 to 15 mils in thickness, but this is not critical. If desired, the insulating tape 1 may be backed or clad, for reinforcing or other purposes, with an additional strengthening layer (not shown) which may be insulative, conductive, or semiconductive.

As shown in FIG. 1, the insulating tape 1 is provided with a plurality of central apertures 2, substantially equally spaced along the length of tape 1. The apertures 2 are generally located in from the edge of tape 1. As will be apparent hereinafter, the size of the aperture 2 preferably is of a size adapted to contain within the periphery thereof contact regions of a semiconductor pellet. The aperture 2 may, for example, be slightly larger than the surface area of the semiconductor pellet on which the metallic contacts are located.

Figure 2:
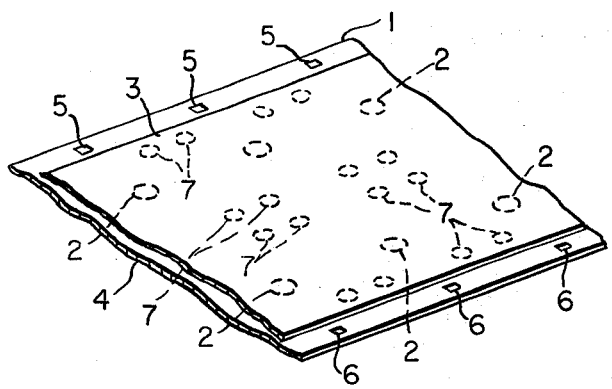
FIG. 2 shows one embodiment of a novel carrier constructed according to the present invention.

As shown in FIG. 2, a thin strip of an essentially continuous electrically insulating tape 1 having prepunched apertures 2 at regularly spaced intervals is supplied from a spool or reel (not shown) and a thin foil-like strip or layer 3 of metallic electrically conducting material is secured to tape 1 by any suitable means such as adhesive lamination. Generally the metallic layer has a thickness of from 0.2 to 3 mils. Copper about 0.7 to about 1.4 mil thick is particularly suitable.

The resulting laminate of tape 1 and metallic layer 3 is more clearly shown at 4 in FIG. 2 and provides an elongated essentially continuous carrier or article which is useful according to the invention as hereinafter described. Also shown in FIG. 2 are a plurality of marginal indexing openings 5 and 6, extending entirely through tape 1 for indexing and positioning of the tape for exposure. Also provided are apertures 7 in tape 1 which are covered with metallic layer 3. Each of apertures 2 is of a size adapted to contain within the periphery thereof contact regions of a semiconductive device. The metallic layer 3 adheres to the tape 1 in at least the regions of the tape surface adjacent apertures 2 and 7, and metallic layer 3 extends across and thereby covers each adjacent aperture 2 and 7.

Figure 3:
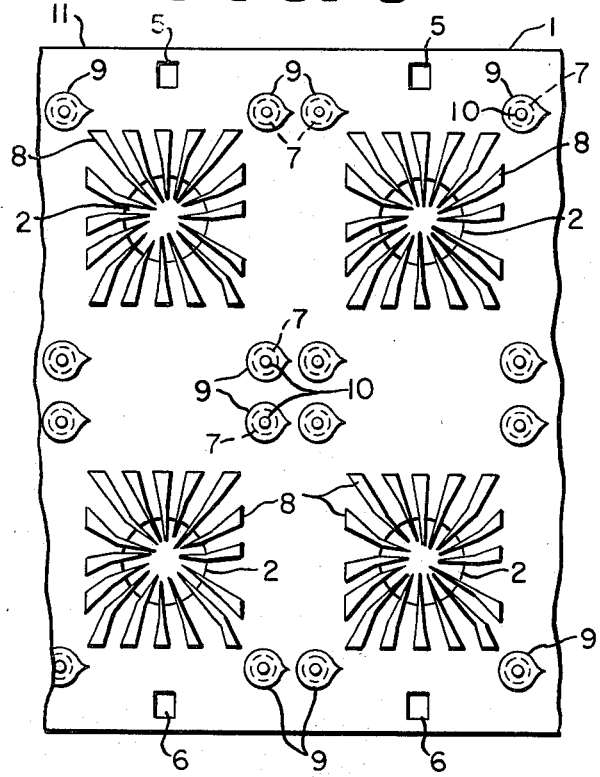
FIG. 3 shows the carrier of FIG. 2 after a subsequent stage of processing according to the present invention.

By photolithographic masking and etching, or other suitable known techniques, portions of metallic layer 3 are removed from tape 1 as shown in FIG. 3 to form a plurality of sets of metallic finger-like leads 8, each set of which leads 8 are adjacent and aperture 2 in tape 1 with the leads 8 of each set arranged in a predetermined pattern of generally radial fingers extending cantilever-wise inwardly beyond the periphery of aperture 2, whereby the inner portions of the leads 8 of each set may be registered with metallic contacts on a semiconductive device disposed within aperture 2. Also formed simultaneously with leads 8 are registration of indexing tear drops 9 which have formed within the periphery thereof indexing apertures 10. If photolithographic etching techniques are used to prepare sets of finger-like leads 8 and tear drops 9, the portions of the reverse faces of the metallic layer 3 exposed by apertures 2 and 7 should be covered by the usual photoresist as well as the outside surface of metallic layer 3 to prevent etchant from attacking the underside of finger-like leads 8 or tear drops 9. After the etching step, the remaining resist is removed from finger-like leads 8 and tear drops 9. After formation of the sets of finger-like leads 8 and tear drops 9, the processed carrier indicated generally at 11 will appear as shown in FIG. 3. FIG. 3 depicts a portion of the carrier 11 having four apertures 2, four set of finger-like leads 8, and sixteen tear drops 9. The sets of finger-like leads 8 and tear drops 9 adhere to the insulating tape 1.

Figure 4:
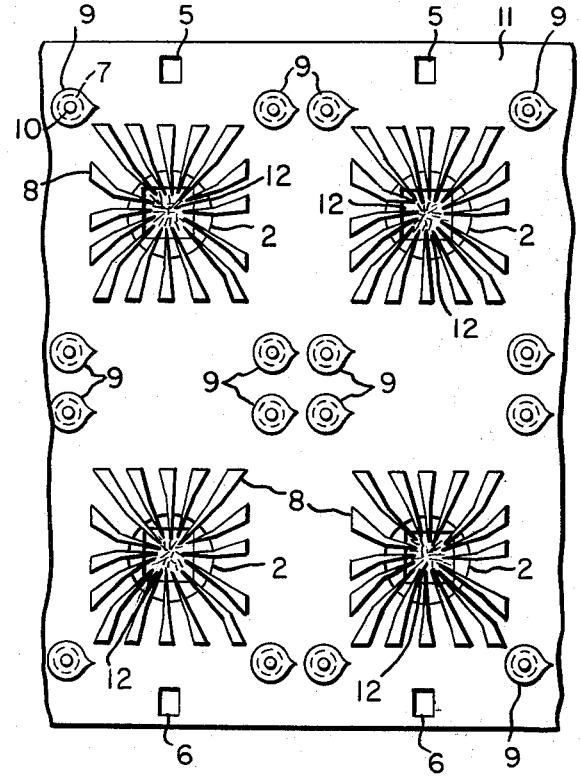
FIG. 4 is similar to FIG. 3, showing a later stage with the semiconductor device attached.
Figure 5:
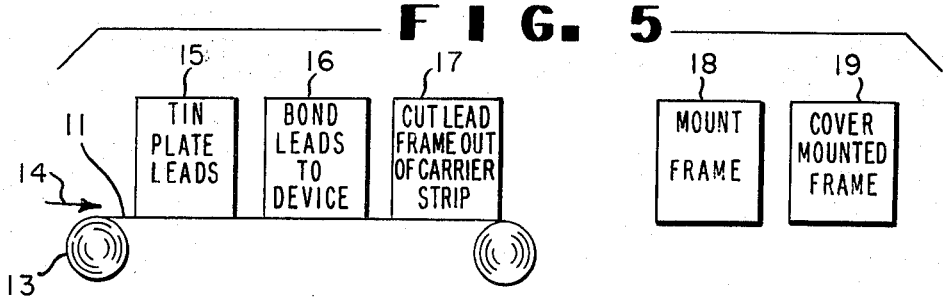
FIG. 5 is a block diagram of the process of attaching semiconductive devices to the carrier of FIG. 3 and mounting the attached devices.

According to the invention, a series of semiconductive devices 12 are attached to carrier 11, in registry with respective apertures 2 and sets of finger-like leads 8, as shown in FIGS. 4 and 5. As shown in FIG. 5, a continuous strip of the carrier 11 is unwound from a reel 13 in the direction indicated by arrow 14. The carrier 11, having sets of finger-like leads 8, is first immersed in a suitable plating solution to plate all the exposed portions of sets of finger-like leads 8 (tear drops 9 need not be so coated) with a suitable bondable metal such as tin, as depicted by 15, including the back portions of leads 8 where the reverse faces of the leads 8 may be exposed. When it is desired to expose the reverse faces of the ends of sets of finger-like leads 8, the insulating tape 1 should be previously removed therefrom prior to forming the sets of finger-like leads. This is shown in FIg. 11 of U.S. Pat. No. 3,689,991, issued Sept. 12, 1972, to Alanson D. Aird. the disclosure of which is hereby incorporated by reference. Relative movement is effected between carrier 11 and successive semiconductor devices 12, so that the inner end portions of each set of leads are brought into registry with the metallic contacts on a respective semiconductive device, and thus according to the step depicted by the numeral 16, the contacts of each semiconductive device 12 may be bonded to the inner ends of the finger-like leads forming a set of finger-like leads 8 at the inner end portions of such leads 8. As shown in FIG. 5, each set of finger-like leads with its respective semiconductive device can then be severed from the carrier as shown by step 17 and the outer end portions of leads can be bonded to lead frame as in 18. The semiconductive device and lead frame may then be encapsulated and covered as in 19. Also the leads of a set may be removed from tape layer 1 by peeling, stripping, dissolution of the laminating adhesive, or in any other suitable fashion, in which case the layer 1 need not be limited to electrically insulating material, but may be, for example, metal or any other suitable flexible material.

FIG. 6 depicts a preferred arrangement for bonding the leads 8 to semiconductive device 12. As shown therein, a semiconductive device 12 which may be, for example, a planar transistor pellet which has a plurality of electrical contact lands 20 equal in number to the number of leads 8 in each set of leads. Generally these electrical contact lands 20 are gold covered. These lands 20 are attached to electrically active regions of the semiconductive device 12. The semiconductive device 12 is placed face up in a depression or on another suitable surface such as a special wax which is adapted to hold semiconductive device 12 in a predetermined position with respect to indexing pins 22 and 23 mounted on press 21, which engages hole 10 in tear drop 9. Thus the indexing between leads 8 and metal contact lands 20 of semiconductive device 12 is achieved. To effect the bonding of the contact lands 20 to the leads 8 which have now been tinned, the leads 8 are pressed down against the gold surface of the contact lands 20 by heated bonding tip 24. The press 21 can serve as a heat sink to prevent thermal damage to semiconductive device 12.

FIG. 7 depicts an enlarged view of semiconductive device 12 having a plurality of metallic contacts 20 which the inner terminations of sets of finger-like leads 8 are bonded. FIG. 7 shows the carrier still intact.

After the carrier is removed from the leads 8 and semiconductive device 12, they are encapsulated in a suitable plastic member 25. FIG. 8 shows such a plastic member 25 having centrally mounted therein semiconductive device 12. The carrier 25 shown in FIG. 8 is made of a plastic material and has lead frame 26 partially encapsulated therein. Leads 8 are bonded to contacts 27 which are in electrical contacts with the leads of lead frame 26. Leads of lead frame 26, in turn, are adapted to be soldered to conventional wires or contact electrical leads in a plug.

While it is preferred to have the indexing marks or holes and the ends of the leads situated over holes in the carrier strip this is not necessary as can be seen from an inspection of U.S. Pat. No. 3,440,027.

I claim:

1. A process for preparing sets of finger-like leads and mounting them on semiconductive devices comprising forming first holes in a carrier strip which holes are adapted to surround a semiconductive device, forming second holes in said carrier strip adjacent said first holes and spaced in a predetermined registration with said first holes, applying a metallic layer to said carrier strip, which metallic layer covers said first and second holes, which metallic layer is of a metal suitable for forming sets of finger-like leads, and which metallic layer is intimately adhered to said carrier at least in the areas immediately surrounding said holes, applying a resist to said metallic layer which partially overlies said first holes in a pattern to form said sets of finger-like leads over said first holes and which overlies said second holes, except for an aperture smaller than and surrounded by each of said second holes to form indexing holes over said second holes, etching away the metallic layer not covered by the resist to simultaneously form sets of finger-like metallic leads, and apertured metallic indexing members protruding over said second holes, and bonding semiconductive devices to the sets of finger-like leads using the etched indexing holes to achieve the registration between the lead frame and the semiconductive device.

2. The process of claim 1 wherein the metal is copper.

* * * * *